United States Patent [19]

Akhtar

[11] Patent Number: 4,705,701
[45] Date of Patent: Nov. 10, 1987

[54] CONDUCTIVE TIN OXIDE METHODS

[75] Inventor: Masud Akhtar, Lawrenceville, N.J.

[73] Assignee: Chronar Corporation, Princeton, N.J.

[21] Appl. No.: 671,213

[22] Filed: Nov. 14, 1984

[51] Int. Cl.[4] .............................................. B05D 5/12
[52] U.S. Cl. ..................................... 427/110; 427/57; 427/126.3; 427/168
[58] Field of Search ...................... 427/126.3, 110, 168, 427/57

[56] References Cited

U.S. PATENT DOCUMENTS

| | | | |
|---|---|---|---|
| 4,146,657 | 3/1979 | Gordon | 427/74 X |
| 4,172,159 | 10/1979 | Marcault | 427/110 X |
| 4,263,335 | 4/1981 | Wagner et al. | 427/110 X |
| 4,265,974 | 5/1981 | Gordon | 427/82 X |

Primary Examiner—Bernard D. Pianalto
Attorney, Agent, or Firm—George E. Kersey

[57] ABSTRACT

The method of producing transparent and conductive tin oxide, which comprised the steps of
(a) providing a phosphorous fluoride or a non-matallic halocarbon where the halogen consists of fluorine;
(b) providing an organotin compound; and
(c) applying the combination of said fluoride or said halocarbon and said organotin compound to a substrate in an oxidizing atmosphere.

19 Claims, 2 Drawing Figures

CONDUCTIVE TIN OXIDE METHODS

BACKGROUND OF THE INVENTION

This invention relates to conductive and optically transparent materials, and, more particularly, to conductive tin oxides and their production.

Films of tin oxide ordinarily are produced by the pyrolysis of inorganic, as well as organometallic compounds of tin, in an oxygen containing atmosphere. The properties of the films thus produced can be modified by the addition of small amounts of other elements such as phosphorus, arsenic, antimony, cadmium, indium, and fluorine. The resulting films or coatings are useful in many electronic and optical devices.

Previous processes for the production of such films have involved the spraying of tin-salt solutions on hot substrates. Examples are found in U.S. Pat. Nos. 2,617,745; 2,651,585 and 3,949,146. The spraying processes of these patents involve the possible inclusion of undesirable, toxic or corrosive constituents. They also produce such byproducts chlorine, hydrogen chloride and antimony halides. In addition the resulting products have inadequate physical properties.

Among the various dopants that are used for tin oxide modification, fluorine has been found to be a source of such desirable film properties as enhanced electrical conductivity and transparency. Fluorine is preferred over antimony which is metallic and toxic. The prior art has provided for the introduction of fluorine into tin oxide from hydrogen fluoride, elemental fluorine gas, or ammonium or alkali fluorides. These materials are all highly corrosive. Examples are found in U.S. Pat. Nos. 2,566,346 and 3,677,814. In the latter patent fluorine doped tin oxide is prepared from organotin fluorides. The latter fluorides are not only expensive to prepare, they are difficult to dissolve, and thus present difficulties in spraying. In addition the usual spray mixtures contain such corrosive components as amines and ammonium compounds. Although U.S. Pat. Nos. 4,265,974 and 4,146,657 teach the preparation of fluorine doped tin oxide by chemical vapor deposition, the fluorine source has been limited to either a fluorocarbon derivative of tin which has the fluorine atom in a alpha position relative to the tin, or to the use of fluorocarbon gases with an organotin vapor, which are limited to alpha-fluoroalkyls. The latter have the further objection of introducing secondary halogen atoms which can be undesirable in tin oxide.

Accordingly, it is an object of the invention to facilitate and simplify the production of conductive tin oxide and to realize tin oxide compositions which avoid many of the prior art objections.

Another object of the invention is to achieve the production of conductive tin oxide while avoiding the inclusion of undesirable, toxic or corrosive constituents. A related object is to avoid the production of such byproducts as chlorine and hydrogen chloride.

Still another object of the invention is to improve the physical properties of tin oxide, in particular to increase both the conductivity and transparency of tin oxides. A related object is to achieve the modification of tin oxide by the avoidance of corrosive constituents. Another related object is to introduce fluorine as a dopant while avoiding the corrosive actions of elemental fluorine gas and ammonium or alkali fluorides.

SUMMARY OF THE INVENTION

In accomplishing the foregoing and related objects, the invention provides for the production of transparent and conductive tin oxide by providing a phosphorus fluoride, or a halocarbon in which the halogen consists of fluorine, and applying the combination of the fluoride or halocarbon with an organotin compound to a substrate in an oxidizing atmosphere.

In accordance with one aspect of the invention, the halocarbon or fluoride is volatile; and the halocarbon is an alkyl, aryl, vinyl, oxy, or amino fluorocarbon.

In accordance with another aspect of the invention, the halocarbon is fully fluorinated and includes tetrafluoromethane and higher order saturated hydrocarbons; hexafluoropropylene and higher order unsaturated hydrocarbons; hexafluorobenzine and higher order aryls; tetrafluoroethylene and other vinyls; hexafluoroacetone and other oxys; bistrifluoromethylamine and other amines.

In accordance with a further aspect of the invention, the halocarbon can be partially fluorinated and includes trifluoromethane and other partially fluorinated alkyls; pentafluorobenezene and other partially fluorinated aryls; trifluoroethylene and other partially fluorinated vinyls; ethyltrifluoroacetate and other partially fluorinated oxys; trifluoroethylamine and other partially fluorinated amines.

In accordance with yet another aspect of the invention, the phosphorus fluoride is fully fluorinated and includes phosphorus pentafluoride and phosphorus trifluoride. The phosphorus fluoride may also be partially fluorinated and include phosphorus oxytrifluoride; methyl phosphorus tetrafluoride; trifluoromethyl; phosphorus tetrafluoride; and ammonium phosphohexafluoride.

In accordance with a still further aspect of the invention, a separate phosphorus dopant may be employed or be included in the halocarbon. A suitable organotin compound has the formula $R_xSnX_y$, where R is a hydrocarbon; X is a halogen, hydride or a fluorocarbon; and x ranges from 0 to 4, while y ranges from 4 to 0, with the sum of x and y being 4.

In accordance with still another aspect of the invention, the desired tin oxide is formed on a substrate at a temperature in the range from about 400° C. to about 600° C. The organotin compound used in the formation can be fully or partially alkylated, and include tin fluorocarbons, alkyl tin oxide, alkyl tin halides, or an alkyl tin alkylate. The organotin compound can be oxidized before being deposited. The dopant can be controlled in its resistance characteristic by varying the amount of dopant which can be fluorine, phosphorus, or a combination of fluorine and phosphorus. The desired deposit can be made by chemical vapor deposition upon a substrate maintained at a temperature above about 500° C.

In accordance with a still further aspect of the invention the desired deposit can be formed by ultrasonic spraying with the rate controlled by a flowmeter and an aersol used as a carrier for the reactants, which form a deposit upon a substrate maintained at a temperature of about 600° C.

DESCRIPTION OF THE DRAWINGS

Other aspects of the invention will become apparent after considering several illustrative embodiments, taken in conjunction with the drawings, in which.

DETAILED DESCRIPTION

Figure 1:
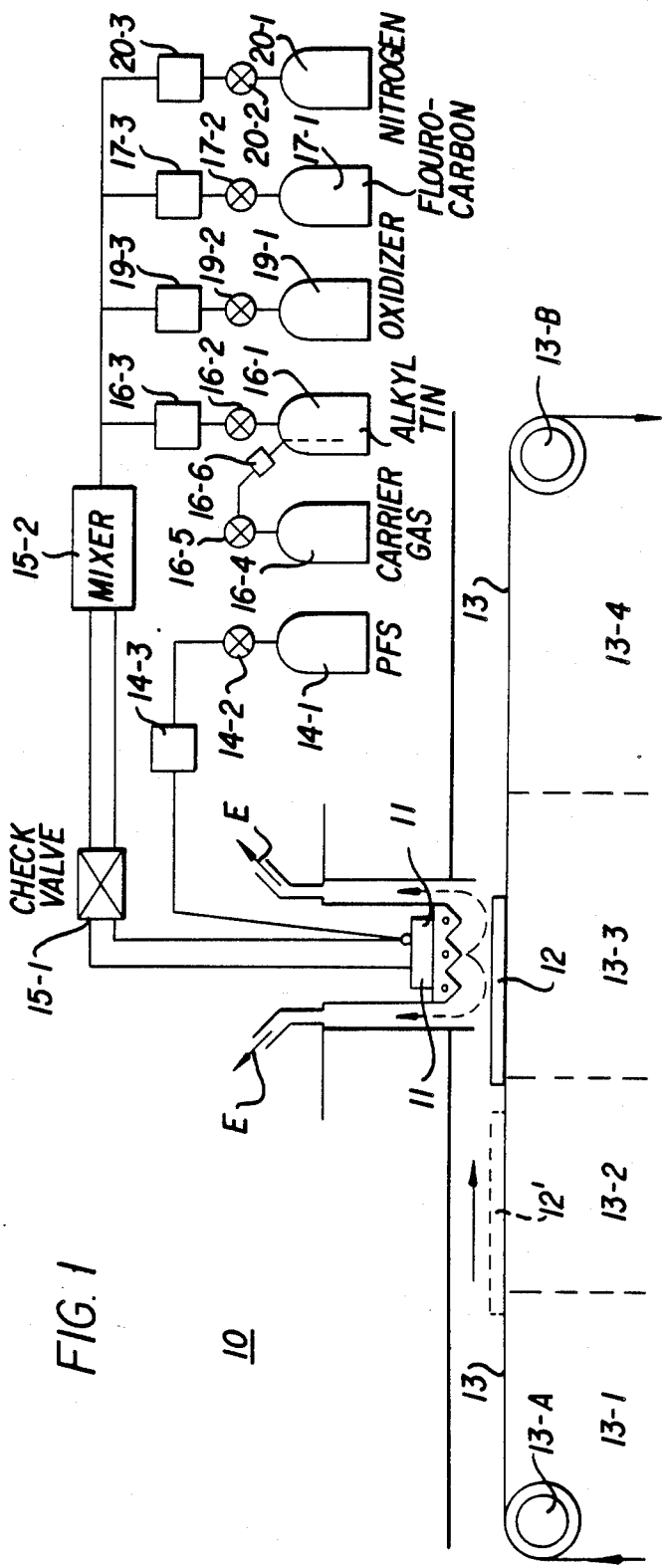
FIG. 1 is a schematic diagram of a system for the deposition of conductive tin oxide by chemical vapor deposition.

With reference to FIG. 1, a system 10 for the deposit of conductive tin oxide by chemical vapor deposition includes a spray head 11 which is used for the combination of ingredients upon a substrate 12 which is transported by a belt 13 through a succession of temperature zones 13-1 through 13-4.

The first temperature zone 13-1 in maintained at a temperature in the range from about 350° C. to about 500° C. In the succeeding zone 13-2 the temperature is elevated slightly above that of the first zone 13-1 to about 580° C. In the third zone 13-3, directly below the spray head 11, the temperature is lowered slightly below that of zone 2 to an illustrative level of about 575° C. The actual temperature of the substrate 13 in the deposition zone 13-3 is in the range from about 500° C. to about 525° C. Once the substrate leaves the deposition zone 13-3 it enters a final cooling zone 13-4 where the temperature is in the range from about 560° C. to as low as 350° C.

The ingredients supplied to the spray head 11 are in two groups. Phosphorus pentafluoride can be applied from a source 14-1 through a valve 14-2 and a flowmeter 14-3 directly to the head 11. The remaining ingredients can be applied through a check valve 15-1 from a mixer 15-2. The ingredients which are applied to the mixer can include alkyl tin from a source 16-1 through a valve 16-2 and a flowmeter 16-3. A carrier gas such as nitrogen can be applied from a source 16-4 through a valve 16-5 and a flowmeter 16-6 to the source 16-1 of alkyl tin. The fluorocarbon can be applied to the mixer 15-2 from a source 17-1 through a valve 17-2 and a flowmeter 17-3. Nitrogen can be applied from a source 18-1 though a valve 18-2 and a flowmeter 18-3. Finally, oxygen can be applied from an oxidizer 19-1 through a valve 19-2 and a flowmeter 19-3.

The spray head 11 is air cooled to about 150° C. The sprayed vapors V impinge upon the heated substrate 12 which is positioned at an approximate distance of two centimeters from the head 11, and the non-reacted vapors are eliminated from the deposition chamber C by exhaust vents E. The belt speed is on the order of one foot per minute as governed by driven pulleys 13-a and 13-b.

Figure 2:
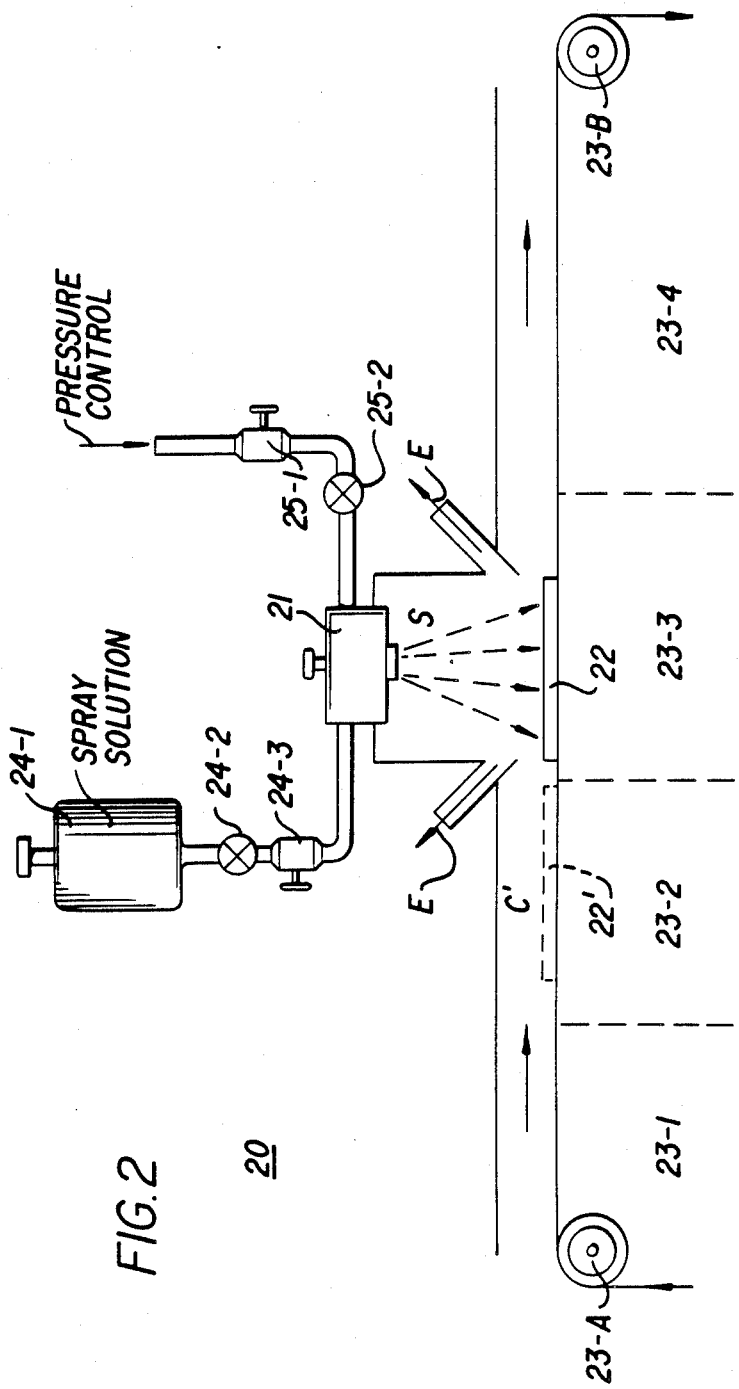
FIG. 2 is a schematic diagram of a system for the deposition of conductive tin oxide by spray pyrolysis.

An alternative system 20 for the deposit of conductive tin oxide is shown in FIG. 2. In the system 20 a spray head 21 is used for the spray pyrolysis of a spray solution S upon a substrate 22 in a deposition zone 23-3 of a chamber C'.

It is to be noted that the arrangement of FIG. 2 is a top view so that the substrate 22 is shown at its end and the substrate is clamped and held vertically by a driven belt 23. The drive for the belt is by pulleys 23-a and 23-b. The belt moves the substrate 22 through a first zone 23-1 at a temperature in the range from about 305° C. to about 500° C. From the first zone the substrate moves to a second zone 23-2 at a temperature of about 620° C. In the deposition zone 23-3 the temperature is about 580° C., but the corresponding substrate temperature is on the order of 600° C. A suitable distance between the spray head 21 and the substrate 22 is on the order of eighteen inches. After leaving the deposition zone 23-3, the substrate 22 enters a cooling zone 23-4 where the temperature is in the range from about 500° C. to as low as 350° C.

The spray solution for the spray head 21 is included in a source 24-1 which permits the solution to be applied through a valve 24-2 and a liquid flowmeter 24-3. Oxygen or air pressure is applied to the head 21 through a control unit 25-1 and a valve 25-2.

The deposition chamber C' is water cooled to about 35° C. An illustrative speed for the belt 23 is on the order of two feet per minute.

The various ingredients which are employed in the systems 10 and 20 of FIGS. 1 and 2 are as described above and are further illustrated in the following non-limiting examples.

EXAMPLE I

Tetramethyltin flowing at a rate of 0.3 liters per minute in nitrogen was oxidized by oxygen gas flowing at a rate of 2.0 liters per minute in the presence of hexafluoropropylene flowing at a rate 0.05 liters per minute. The total pressure was one atmosphere including the nitrogen gas carrier.

The deposition was conducted at a temperature of 520° C. on glass substrates using the system of FIG. 1, with a belt speed of about one foot per minute.

A film with a thickness of about one micron was obtained having a sheet resistance of about 5 ohms per square. The film was 85% transparent for light in the visible range.

EXAMPLE II

Example I was repeated using tetrafluoromethane with a flow rate of about 0.75 liters per minute, in place of hexafluoropropylene.

The flow rate of the fluorocarbon gas was adjusted to obtain the desired sheet resistance.

The resulting deposit had characteristics substantially those obtained for Example I.

EXAMPLE III

Example I was repeated with phosphorus pentafluoride flowing at a rate 0.01 liters per minute substituted for hexafluoropropylene.

The resulting deposit had a resistance of 3 ohms per square and a transparency of 82% for light in the visible range. The example illustrates the utility of phosphorus fluorides with volatile or volatizable organotin compounds.

EXAMPLE IV

To illustrate the spray pyrolysis system of FIG. 2, the following solution was formed:
3.0 grams of ammonium phosphohexafluoride
30.0 grams of tetramethyltin
Sufficient methyl alcohol to make a solution of about 1 liter.

The solution was sprayed on a glass substrate at about 600° C. for 30 seconds with a spray rate adjusted by the use of oxygen gas to produce two cubic centimeters per second.

The resulting film had a sheet resistance of 10 ohms per square and a transmission of 83% for visible light. The film thickness was about one-half micron.

EXAMPLE V

Example IV was repeated using an alternative one liter solution in methyl alcohol of the following ingredients:
35 grams of tetramethyltin
60 grams of bis-Trifluoromethylamine.

The result was a film of 0.4 micron thickness with 80% transparency and a sheet resistance of about 13 ohms per square.

EXAMPLE VI

Example V is repeated with tetramethyl tin replaced by dibutyltin diacetate and bis-Trifluoromethylamine replaced by hexafluorobenzene.

The results are similar to those of Example V.

Other aspects of the invention will be apparent to those of ordinary skill in the art on the basis of the foregoing disclosure.

What is claimed is:

1. The method of producing transparent and conductive tin oxide, which comprises the steps of
   (a) providing a phosphorous fluoride or a non-metallic halocarbon where the halogen consists of fluorine;
   (b) providing an organotin compound; and
   (c) applying the combination of said fluoride or said halocarbon and said organotin compound to a substrate in an oxidizing atmosphere.
2. The method of claim 1 wherein said halocarbon or said fluoride is volatile.
3. The method of claim 1 wherein said halocarbon is an alkyl, aryl, vinyl, oxy or amino fluorocarbon.
4. The method of claim 3 wherein said halocarbon is fully fluorinated and includes tetrafluoromethane and higher order saturated hydrocarbons; hexafluoropropylene and higher order unsaturated hydrocarbons, hexafluorobenzene and higher order aryls, tetrafluoroethylene and other vinyls, hexafluoroacetone and other oxys; bitrifluoromethylamine and other amines.
5. The method of claim 3 wherein said halocarbon is partially fluorinated, including trifluoromethane and other partially fluorinated alkyls; pentafluorobenzene and other partially fluorinated aryls; trifluoroethylene and other partially fluorinated vinyls; ethyltrifluoroacetate and other partially fluorinated oxys; trifluoroethylamine and other partially fluorinated amines.
6. The method of claim 1 wherein said phosphorous fluoride is fully fluorinated and includes phosphorous pentafluoride and phosphorous trifluoride.
7. The method of claim 1 wherein said phosphorous fluoride is partially fluorinated and includes phosphorous oxytrifluoride; methyl phosphorous tetrafluoride; trifluoromethyl; phosphorous tetrafluoride; and ammonium phosphohexafluoride.
8. The method of claim 1 further including a phosphorous dopant.
9. The method fo claim 8 wherein said phosphorous dopant is included in the halocarbon.
10. The method of claim 1 wherein said organotin compound has the formula $R_xSnX_y$, where R is a hydrocarbon group, X is a halogen, hydride or fluorocarbon, x ranges from 0 to 4 and y ranges from 4 to 0, with the sum of x and y being 4.
11. A transparent and conductive tin oxide which comprises the reaction product of (a) a non-metallic halocarbon consisting of a fluorine halogen or (b) a phosphorous fluoride, combined with an organotin compound, and deposited on a substrate at a temperature in the range from about 400° C. to 600° C.
12. The composition of claim 11 wherein said organotin compound is fully alkylated.
13. The composition of claim 11 wherein said organotin compound is partially alkylated and includes tin fluorocarbons, alkyl tin oxide, alkyl tin halide or alkyl tin alkylate.
14. The method of producing a transparent and conductive tin oxide which comprises the steps of
   (a) oxidizing an organotin compound in the presence of a phosphorous fluoride or a non-metallic halocarbon containing only a fluorine halogen;
   (b) depositing the reaction product of step (a) at a temperature in the range of from about 450° C. to 620° C.
15. The method of claim 14 wherein the resistance characteristic of the dopant is controlled by varying the amount of dopant in the form of fluorine or phosphorous, and also in the form of fluorine plus phosphorus.
16. The method of claim 14 wherein said deposit is formed by chemical vapor deposition with a substrate maintained at a range of about 500° C.
17. The method of claim 14 wherein the deposit is formed by ultrasonic spraying of the combination of an organotin compound and a fluorocarbon or fluorophosphide subjected to gas pressure; and a flowmeter controls the rate at which the spray solution is applied to a substrate.
18. The method of claim 17 wherein said substrate is maintained at a temperature of about 600° C.
19. The method of claim 17 wherein an aersol is used as a carrier for the reactants.

* * * * *